United States Patent [19]

Sander et al.

[11] 4,151,540

[45] Apr. 24, 1979

[54] HIGH BETA, HIGH FREQUENCY TRANSISTOR STRUCTURE

[75] Inventors: Wendell B. Sander, San Jose; William H. Shepherd, Palo Alto, both of Calif.

[73] Assignee: Fairchild Camera and Instrument Corporation, Mountain View, Calif.

[21] Appl. No.: 858,572

[22] Filed: Dec. 8, 1977

[51] Int. Cl.² .............................................. H01L 29/72
[52] U.S. Cl. ........................................ 357/34; 357/55; 357/88; 357/89; 357/91
[58] Field of Search ....................... 357/34, 55, 88, 89, 357/91

[56] References Cited

U.S. PATENT DOCUMENTS

| | | | |
|---|---|---|---|
| 3,906,545 | 9/1975 | Schlangenotto et al. | 357/68 |
| 4,007,474 | 2/1977 | Yagi et al. | 357/34 |
| 4,035,825 | 7/1977 | Kirschner | 357/34 |

Primary Examiner—Edward J. Wojciechowicz
Attorney, Agent, or Firm—Alan H. MacPherson; Robert C. Colwell; Paul J. Winters

[57] ABSTRACT

High beta, high frequency transistors require very narrow and high resistance base structures, thereby placing a low limit of collector-emitter voltages that may be used without encountering "punch-through" breakdown. This invention permits the use of normal collector-emitter voltages without danger of punch-through problems by injecting into the high resistance base material an impurity grid that serves both as an electrostatic shield to increase the voltage breakdown level, and as a means of reducing the apparent lateral base resistance, thereby further increasing the high frequency capability of the device without degrading the high beta characteristics.

5 Claims, 5 Drawing Figures

HIGH BETA, HIGH FREQUENCY TRANSISTOR STRUCTURE

BACKGROUND OF THE INVENTION

1. Field of the Invention

This invention relates to the construction of semiconductive devices, and particularly to a novel transistor structure that reduces collector-emitter punch-through problems, thereby improving transistor speed and gain limitations.

2. Prior Art

In the construction of conventional bipolar transistors, the d.c. current gain can be, to a first order, approximated as the ratio of net charge, hence the impurity concentration, of the emitter to that of the base. Since the emitter electrode is always heavily doped, its net charge may be considered as a constant at a given emitter thickness so that the beta of the transistor is increased most effectively by reducing the net charge on the base, i.e., increasing the resistivity of lightly doping the base structure.

Improving the upper frequency limitation of a transistor is most readily accomplished by making the base element very thin or narrow, and by reducing the base spreading resistance and the total effective capacitance associated with the collector-base junction. However, during operation of such a transistor fabricated with a high resistivity base to obtain high beta and a low collector-base capacitance and a very narrow base to increase the frequency limitation, the collector depletion layer may extend through the entire base region into the emitter, thus forming a "punch-through" voltage breakdown and completing a current path between the collector and the emitter. Furthermore, an additional problem is introduced since the narrowing of the base and the high resistivity used, increases the base spreading resistance. In an attempt to obtain a very high amplification and frequency, some transistors are fabricated with the very narrow lightly doped base structures, but these "super-beta" or punch-through transistors must be provided with precise voltage protection to maintain the transistor below its breakdown voltage.

BRIEF SUMMARY OF THE INVENTION

The present invention greatly extends punch-through limitations, thus permitting the use of relatively high collector-emitter voltages with transistors fabricated with thin high resistivity base structures for high-frequency, high-beta applications.

Briefly described, the invention comprises the introduction of a plurality of heavily doped regions of the same conductivity type as the base material into the base structure in the region of the base-emitter junction. This heavily doped region acts as an electrostatic shield inhibiting the field gradient in the low charge active base from permitting the collector or emitter depletion regions from reaching punch-through. Thus, the device becomes a two-dimensional structure which permits a combination of transistor parameters that cannot be realized with conventional one-dimensional transistor structures.

The heavily doped region in the base material also provides the beneficial effect of further increasing high frequency performance of the transistor by reducing the apparent base resistance, thereby lowering the base resistance-collector capacitance product.

DESCRIPTION OF THE DRAWINGS

In the drawings which illustrate a preferred embodiment of the invention:

FIG. 5 is a structural elevation diagram of a tetrode form of NPN transistor fabricated with a MOS-type gate to vary the width of the base region that is provided with a heavily doped grid for preventing punch-through.

DETAILED DESCRIPTION

Figure 1:
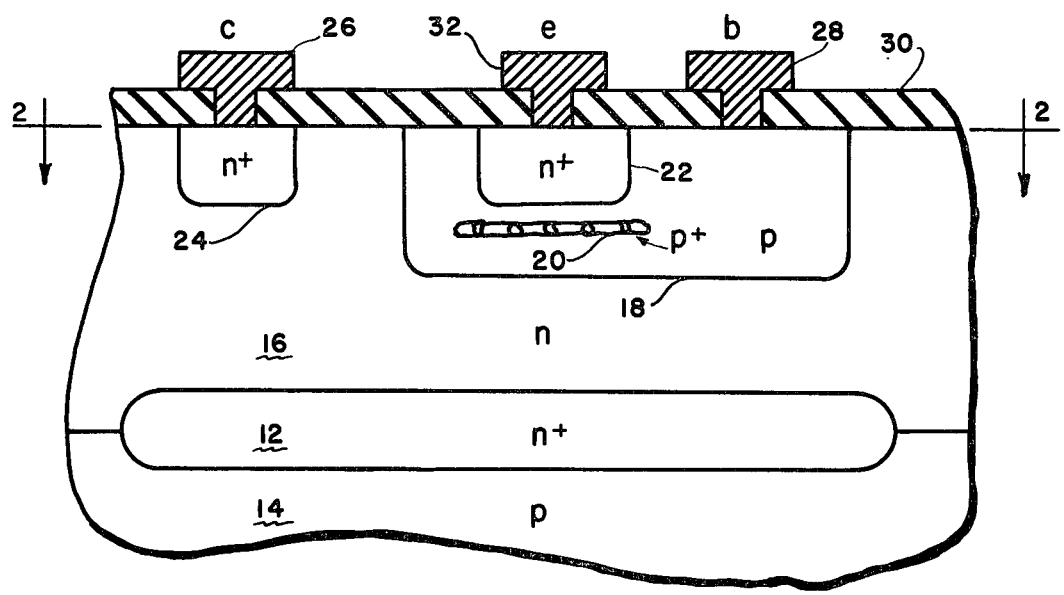
FIG. 1 is a structural diagram illustrating a typical double diffused epitaxial NPN transistor with the low resistance, heavily doped regions in the high resistivity base structure.

FIG. 1 is a structural cross-sectional view of a typical bipolar transistor. An NPN-type bipolar transistor is illustrated but it will be apparent that the invention applies equally to PNP transistors and may also be applied to other types of devices, as will be subsequently described. The transistor 10 is fabricated by conventional methods, such as by the steps described in detail in U.S. Pat. No. 3,873,989 to R. Schinella et al. Briefly, the initial steps may be, for example:

1. Forming a low resistivity buried N-type layer 12 upon a masked P-type silicon substrate wafer 14.
2. Growing an N-type epitaxial layer 16 over the buried layer 12.
3. Utilizing photo masking techniques, diffuse a low concentration of P-type impurity into the layer 16 to form a high resistivity base region 18.

At this point, the process may deviate from the conventional process and a high conductivity P-type grid 20 may now be fabricated into the P-type base layer 18. While grid 20 may be fabricated to diffusion techniques, it is preferably fabricated by ion implantation techniques, such as those described in the aforementioned U.S. Pat. No. 3,873,989. A thick silicon dioxide layer is formed over the entire exposed surface of the structure and is etched away from at least that portion of the surface area that will eventually be formed into an emitter region 22. Bars of low resistivity P-type material are then implanted deep within the base region 18 to create a grid 20 substantially perpendicular to the direction of collector-emitter current flow.

Figure 2:
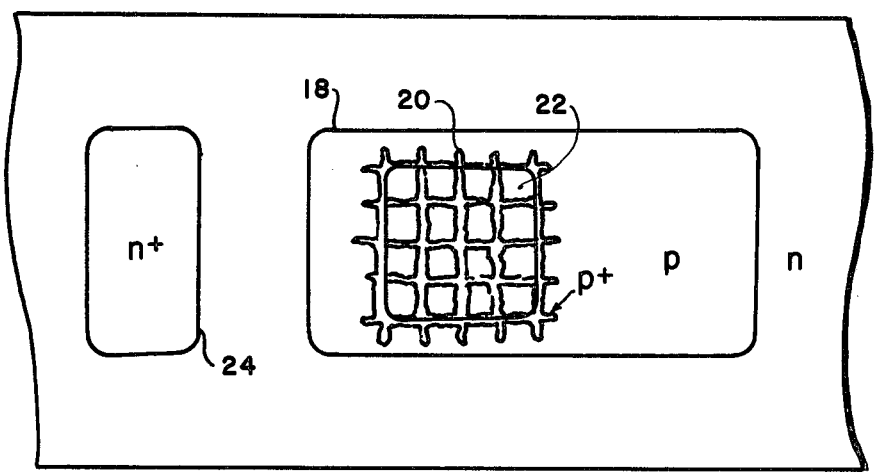
FIG. 2 is a plan view taken along the lines 2—2 of FIG. 1 and illustrates the approximate relative structure and positioning of the heavily doped regions of the invention.

FIG. 2 illustrates the lateral geometry of the transistor structure illustrated in FIG. 1 and shows the grid 20 formed by a plurality of small bars aligned in rows and columns across the area that will be occupied by the emitter region 22. It should be pointed out that alignment is not essential but is desirable to assure a reasonably even distribution of the low resistivity bars forming the grid 20. Bar alignment may be readily obtained, for example, by use of a photoresist mask with the grid openings formed by optical interference fringes.

As previously mentioned, the bars forming the low resistivity grid 20 are driven deep within the base region 18, as shown in FIG. 1. By use of conventional techniques, a low resistivity N-type material is then diffused through the transistor surface to form the emitter region 22 and a similar low resistivity region 24 is formed to provide a low resistance path from the active collector region 16 to the metallic collector contact 26.

If preferred, the process of fabricating the grid 20, described above, may be deferred and at this point the high conductivity P-type grid 20 may be implanted through the N-type emitter region 22 into the base region 18. The implantation energy must be adequate to assure that the P-type impurity ions completely penetrate through the emitter region 22 to form an electrostatic shield grid in the base region. Following the grid fabrication standard fabrication techniques are followed. For example, the surface is coated with a passivation layer 30 and the metallic emitter contact 32 is applied. A similar metallic contact 28 extends through the passivation layer 30 into the high resistivity base region 18.

Figure 3:
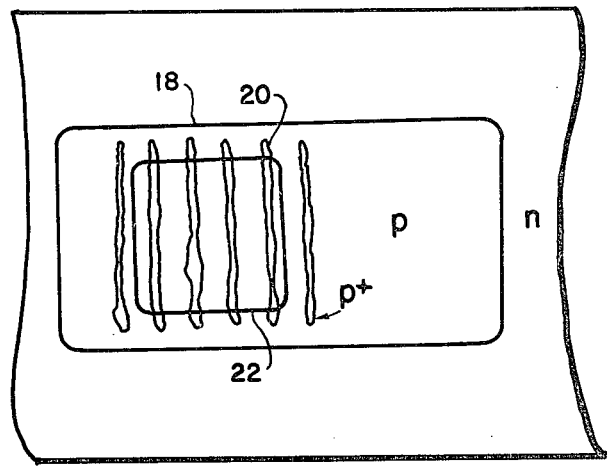
FIG. 3 is a plan view illustrating an alternative grid configuration for the heavily doped region.
Figure 4:
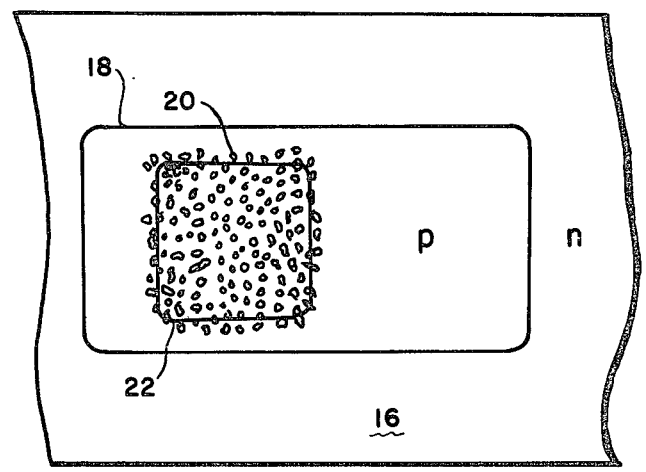
FIG. 4 is a plan view illustrating another alternative configuration of the heavily doped grid.

FIGS. 3 and 4 are views illustrating alternate configurations for the formation of a grid in the base region 18. As shown in FIG. 3, the grid 20 may be in the form of a plurality of parallel rods arranged in a plane substantially perpendicular to the collector-emitter current flow. As shown in FIG. 4, the grid 20 may merely be a randomly positioned array of small highly doped regions, also arranged in a similar plane.

It will be appreciated that the views illustrated in FIGS. 1 through 4 are for explanatory purposes and the various layers and deposited regions are not drawn to any scale. In practice, the emitter region 22 may have a surface area of approximately one square micron and may be diffused into a base region 18 that may be 6,000 angstroms in thickness to a thickness of perhaps 2,000 angstroms. The mesh or rods in grid 20 may be less than 1,000 angstroms in diameter and possibly spaced by approximately 3,000 angstroms. It is preferable that the rods and regions that form the grid 20 be spaced from each other as far as possible but not to the point that punch-through breakdown can readily result.

As previously mentioned, the grid 20 of low resistivity material forms an electrostatic shield that controls the width of the collector-base and emitter-base depletion area so that a high beta can be achieved without normal punch-through limitations. An addition advantage obtained by the use of the grid 20 is that the high-frequency limitation is extended. As previously discussed, higher amplification is obtained by increasing the resistivity of the base material. The resulting increase in lateral resistance across the base reduces the upper frequency limit by trapping the collector capacitance deep inside the device and isolating that capacitance with the high value lateral resistance, thus effectively forming a low pass filter. Implanting a grid 20 of low resistance material in the base region 18 reduces the apparent base resistance, thus permitting a high frequency operation than is otherwise obtainable. This is an extremely important feature in transistors designed for switching or digital operation.

Figure 5:
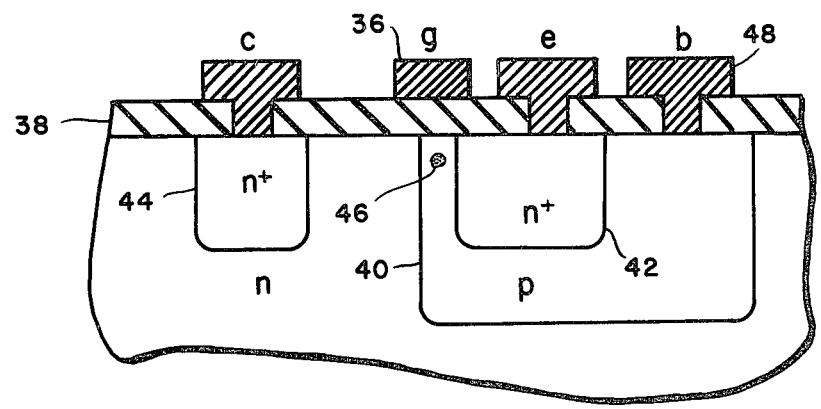

FIG. 5 is a structural elevation diagram of a PNP transistor with a MOS-type gate 36 on the surface of the passivation layer 38 overlying the base region 40 between the emitter 42 and active collector region 44. Aplication of a positive bias on the gate 36 induces a field inversion that depletes a very thin layer at the surface of the base region 40, thus reducing the effective base concentration and permitting very high beta values. In actual tests, it was found that the low current beta could, be varying the gate bias, be varied from a value of one to over 100,000. This variation is possible without a reduction in collector-emitter breakdown voltage levels because the relatively heavily doped P-region adjacent the thin depleted layer acts as an electrostatic shield that inhibits the field gradient in the low charge active base 40 from being suitable to extend the collector or emitter depletion regions to the point where a punch-through breakdown can readily occur.

Frequency limitations and transistor beta can be further improved by narrowing the base region 40 adjacent the passivation layer 33 and between the emitter 42 and collector region 44 and by implanting an electrostatic shield 46 of ions of P-type material to reinforce the normal concentration of P-type material adjacent the thin layer depleted by the bias applied to the gate 36. As shown in FIG. 5, the electrostatic shield 46 is preferably a heavily doped section implanted in the form of a thin cylinder or wire lying on an axis perpendicular to the emitter-collector current path and parallel with the surface adjacent passivation layer 38. Thus, the transistor illustrated in FIG. 5 may be controlled by the normal base element 48 or by the bias applied to gate 36. If desired, both base 48 and gate 36 may be utilized to operate the transistor as a high beta, high frequency tetrode.

What we claim is:

1. In a transistor having an emitter and a collector of a first conductivity type of semiconductor material separated by a high resistivity base structure of a second conductivity type of semiconductor material, the improvement comprising:

an electrostatic shield formed by a heavily doped region of second conductivity type of semiconductor material in said high resistivity base structure in the region of the base-emitter junction for inhibiting punch-through breakdown between collector and emitter of said transistor.

2. The transistor claimed in claim 1 wherein said shield is fabricated in a plane substantially parallel with said base-emitter junction.

3. The transistor claimed in claim 1 wherein said shield is a grid of implanted ions of a second conductivity type of semiconductor impurity.

4. The transistor claimed in claim 1 further including a gate electrode overlying and insulated from said base structure between said emitter and said collector and wherein said shield is formed as a cylinder on an axis parallel to the surface of said gate electrode.

5. The transistor claimed in claim 3 wherein said grid of implanted ions is in a plane substantially parallel with said base-emitter junction.

* * * * *